(12) United States Patent
Pathmanathan

(10) Patent No.: US 10,349,513 B2
(45) Date of Patent: Jul. 9, 2019

(54) CIRCUITS AND METHODS PROVIDING ELECTRONIC BAND GAP (EBG) STRUCTURES AT MEMORY MODULE ELECTRICAL COUPLING

(71) Applicant: QUALCOMM Incorporated, San Diego, CA (US)

(72) Inventor: Priyatharshan Pathmanathan, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/659,187

(22) Filed: Jul. 25, 2017

(65) Prior Publication Data
US 2018/0035533 A1    Feb. 1, 2018

Related U.S. Application Data

(60) Provisional application No. 62/367,836, filed on Jul. 28, 2016.

(51) Int. Cl.
*H05K 1/02*      (2006.01)
*H01L 23/522*    (2006.01)
(Continued)

(52) U.S. Cl.
CPC ....... *H05K 1/0236* (2013.01); *G06F 13/4086* (2013.01); *H01L 23/5227* (2013.01);
(Continued)

(58) Field of Classification Search
CPC .... H05K 1/0236; H05K 1/0213; H05K 1/025; H05K 1/0253; H05K 1/0298;
(Continued)

(56) References Cited

U.S. PATENT DOCUMENTS 3,876,964 A    4/1975 Balaster et al.
6,184,478 B1   2/2001 Imano et al.
(Continued)

FOREIGN PATENT DOCUMENTS

WO    WO-2017037957 A1    3/2017

OTHER PUBLICATIONS

Jaggard D.L., "Bragg Interactions in Periodic Media", Antenna Laboratory Report No. 75, California Institute of Technology, Aug. 1976, pp. 1-190.
(Continued)

*Primary Examiner* — Michael P McFadden
(74) *Attorney, Agent, or Firm* — Haynes and Boone, LLP (36340)

(57) ABSTRACT

A system includes: a printed circuit board having a plurality of conductive traces; a processing device coupled to the printed circuit board and in electrical communication with the plurality of conductive traces; a first memory module and a second memory module in electrical communication with the plurality of conductive traces and sharing channels of the conductive traces, wherein the first memory module is physically more proximate to the processing device than is the second memory module; and an electronic band gap (EBG) structure physically disposed in an area between the first memory module and the second memory module.

20 Claims, 11 Drawing Sheets

(51) Int. Cl.
*H01L 23/528* (2006.01)
*G06F 13/40* (2006.01)

(52) U.S. Cl.
CPC ......... *H01L 23/5286* (2013.01); *H05K 1/025* (2013.01); *H05K 1/0213* (2013.01); *H05K 1/0253* (2013.01); *H05K 1/0298* (2013.01); H05K 1/0225 (2013.01); H05K 2201/029 (2013.01); H05K 2201/09727 (2013.01); H05K 2201/10159 (2013.01)

(58) Field of Classification Search
CPC ........... H05K 1/0225; H05K 2201/029; H05K 2201/09727; H05K 2201/10159; G06F 13/4086; H01L 23/5227; H01L 23/5286
USPC .......................................... 361/748
See application file for complete search history.

(56) References Cited

U.S. PATENT DOCUMENTS

| | | | |
|---|---|---|---|
| 7,839,654 | B2 | 11/2010 | Choi |
| 8,159,413 | B2 | 4/2012 | Park et al. |
| 9,112,475 | B2 | 8/2015 | Sasaki et al. |
| 2004/0130877 | A1 | 7/2004 | Okubora |
| 2008/0157901 | A1* | 7/2008 | Matekovits ............. H01P 1/203 333/204 |
| 2009/0037626 | A1 | 2/2009 | Wilson |
| 2009/0236141 | A1* | 9/2009 | Kim ....................... H01P 1/2005 174/360 |
| 2009/0260864 | A1* | 10/2009 | Lee ....................... H05K 1/0236 174/260 |
| 2011/0061925 | A1* | 3/2011 | Kim ..................... H05K 1/0233 174/377 |
| 2013/0265736 | A1* | 10/2013 | Rokuhara ............ H05K 9/0064 361/783 |
| 2015/0342030 | A1 | 11/2015 | Watanabe et al. |
| 2016/0092351 | A1* | 3/2016 | Uematsu ............. G06F 12/0246 711/103 |

OTHER PUBLICATIONS

International Search Report and Written Opinion—PCT/US2017/043844—ISA/EPO—Oct. 27, 2017.

* cited by examiner

CIRCUITS AND METHODS PROVIDING ELECTRONIC BAND GAP (EBG) STRUCTURES AT MEMORY MODULE ELECTRICAL COUPLING

CROSS-REFERENCE TO RELATED APPLICATIONS

The present application claims the benefit of U.S. Provisional Patent Application No. 62/367,836, filed Jul. 28, 2016, and entitled "Circuits and Methods to Increase Throughput in DIMM-to-DIMM Electrical Coupling", the disclosure of which is incorporated by reference in its entirety.

TECHNICAL FIELD

The present application relates to memory module electrical couplings and, specifically, to electronic band gap (EBG) structures at memory module electrical couplings.

BACKGROUND

Some conventional systems include one or more processor chips mounted to a printed circuit board (PCB) and communicating with memory modules. Thus, in one example, a processor chip is mounted on a PCB and communicates with the memory modules by traces in the PCB. During normal operation, the processor issues read requests and write requests to the memory.

In high bit rate operations, capturing bits may become a challenge because the time window in which to capture a given bit becomes short. Furthermore, various phenomena, such as electromagnetic reflections in the metal traces, may negatively affect the time window in which to capture a given bit. This is especially true for PCBs that are set up with a daisy chain connection from the processor to the memory modules. In the daisy chain architecture, each of the memory modules are connected to a common bus, and electromagnetic reflections may affect the capture of bits at memory modules that are closer to the processor. Thus, severity of electromagnetic reflection phenomena as seen at the nearer memory modules may set a limit as to a maximum bit rate between the processor in the memory modules.

Conventional Tee topology might be used in some solutions, though a conventional Tee topology may be expected to result in diminished performance if only one memory module is used on the PCB. Thus, conventional Tee topology might prevent use of a given board design in single-module applications.

Accordingly, there is a need in the art for systems and methods that allow for increasing bit rates and reduced harmful phenomena, such as electromagnetic reflection.

SUMMARY

Various embodiments reduce electromagnetic reflection through the use of electronic band gap (EBG) structures placed between memory modules. The EBG structures may be used to attenuate electromagnetic reflection and improve performance at least at the memory modules nearer the computer processor.

In one embodiment, a system includes: a printed circuit board having a plurality of conductive traces; a processing device coupled to the printed circuit board and in electrical communication with the plurality of conductive traces; a first memory module and a second memory module in electrical communication with the plurality of conductive traces and sharing channels of the conductive traces, wherein the first memory module is physically more proximate to the processing device than is the second memory module; and an electronic band gap (EBG) structure physically disposed in an area between the first memory module and the second memory module.

In one embodiment, a method includes: propagating electrical signals from a processing device on a printed circuit board to a first memory module and a second memory module in electrical communication with a plurality of conductive traces and sharing channels of the conductive traces, wherein the first memory module is physically more proximate to the processing device than is the second memory module; and attenuating reflections of the electrical signals at an electronic band gap (EBG) structure physically disposed in an area between the first memory module and the second memory module.

In another embodiment, an apparatus includes: means for writing data and reading data, the reading and writing means being coupled to a circuit board; means for storing the data and accessing the data in response to commands from the reading and writing means, the storing and accessing means being coupled to the circuit board; means for propagating electrical signals between the reading and writing means and the storing and accessing means on shared channels; and means for attenuating reflections in the propagating means.

DESCRIPTION

Various embodiments are directed to circuits and methods to increase signal integrity at an electrical coupling between memory modules. For instance, an example embodiment includes a first dual inline memory module (DIMM) and a second DIMM module mounted to a PCB. The PCB itself may include a topmost ground plane, a middle layer having daisy chained metal traces coupling the first DIMM module and the second DIMM module to a processing device. The first DIMM module and the second DIMM module may be placed on the same traces so that the processing device communicates with only one of the DIMM modules at a time.

The PCB also may include a lower ground plane in a layer below the traces. The layers in the PCB may be arranged so that the lower ground plane layer and topmost ground plane layer sandwich the metal traces. One of the ground plane layers may include an electronic band gap (EBG) structure in an area physically between the first DIMM module and the second DIMM module. The EBG structures cause attenuation in the fundamental frequency band of the signals from the processor to the first DIMM module and the second DIMM module. Although the EBG structure causes attenuation, it increases signal integrity at the first DIMM module by reducing reflections and, through conservation of energy, directing more signal energy to the first DIMM module.

Other embodiments may implement the EBG structure in various physical arrangements. For instance, the EBG structure may include rectangular slots cut from the bottom ground plane, where the length dimension of the slots are perpendicular to a length dimension of the metal traces. In another embodiment, the EBG structure includes sinusoidal-shaped slots in the bottom ground plane, where the sinusoidal-shaped slots are parallel to a direction of the metal traces. Of course, just as the EBG structure may be implemented in the bottommost ground plane, other embodiments may additionally or alternatively implement the EBG structure in the topmost ground plane. Yet another embodiment implements the EBG structure as varied trace widths. These embodiments are described in more detail below with respect to FIGS. 1-5.

Moreover, while the various embodiments are described with respect to DIMM modules, it is understood that the scope of embodiments may include any type of memory module in electrical communication with the metal traces. Furthermore, while the embodiments of FIGS. 1-5 are shown with respect to two memory modules, it is understood that the scope of embodiments may include other numbers of memory modules. For instance, some embodiments may include a single memory module on a board with an EBG structure. The other example embodiments may include three or more memory modules on a board with one or more EBG structures.

Figure 1A:
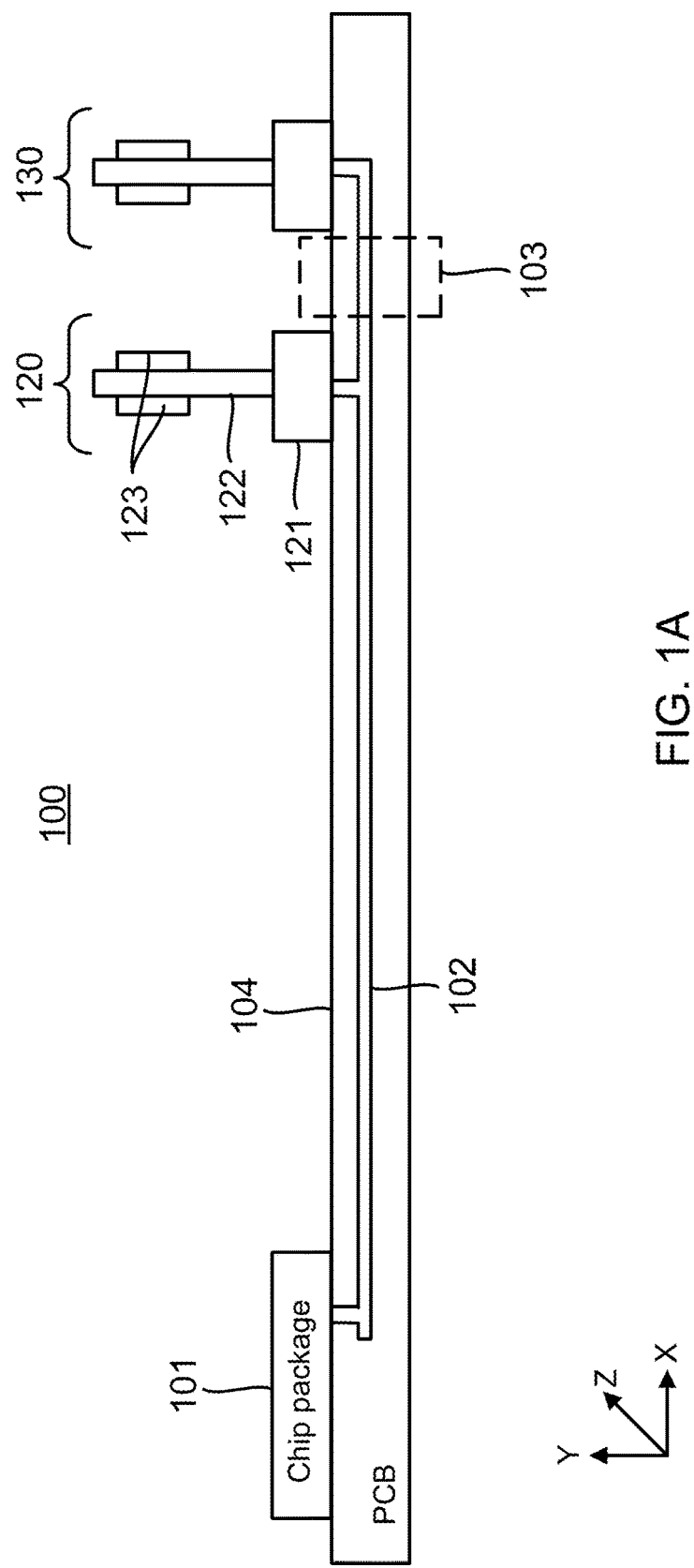
FIG. 1A is an illustration of an example circuit structure according to one embodiment.

FIG. 1A is an illustration of an example system 100, adapted according to one embodiment. The example system 100 includes a chip package 101 coupled to PCB 104. Chip package 101 may include any appropriate processing device, such as a digital signal processor (DSP), a central processing unit (CPU), a system on chip (SOC) having multiple cores, and/or the like. Chip package 101 and the DIMM modules 120, 130 are electrically coupled to conductive traces 102 to carry signals between chip package 101 and the DIMM modules 120, 130.

Printed circuit board 104 includes a plurality of layers of insulating material separating other layers of conductive material. For instance the conductive material may include metals such as copper or copper alloys. The traces 102 are implemented in one layer in this example, although other embodiments may include multiple layers of metal interleaved with layers of insulating material. An example insulating material for a PCB includes FR-4 glass epoxy, although the scope of embodiments is not limited to any particular material for PCB 104.

Figure 1B:
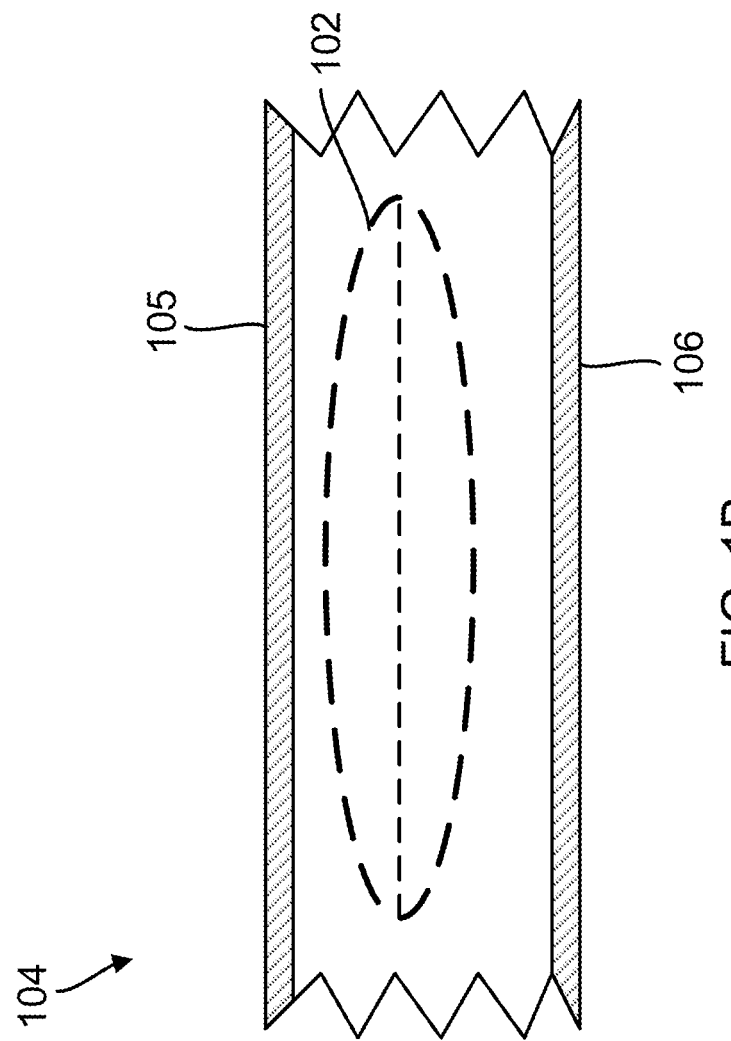
FIG. 1B is an illustration of a portion of an end-on cross-section of the board of FIG. 1A.

FIG. 1A is an illustration of example system 100 shown from a side-on view of the X-Y plane. FIG. 1B complements FIG. 1A by showing a portion of an end-on, cutaway view in the Y-Z plane. FIG. 1B is not drawn to scale. As shown in FIG. 1B, PCB 104 in this example further includes a first conductive ground plane 105 parallel to the traces 102 and in a layer vertically above traces 102 as well as a second conductive ground plane 106 parallel to the traces 102 and vertically in a layer below traces 102. The ground planes 105, 106 would appear as lines in the view shown in FIG. 1A.

Continuing with the example of FIG. 1B, traces 102 are shown as a group of metal lines laid out in a layer of PCB 104. Traces 102 may include any number of independent lines, and in other examples, may include lines in other layers between the ground planes 105, 106. Examples of suitable ground plane material include copper, copper alloys, and the like. Traces 102 are physically separated from ground planes 105, 106 in FIG. 1B by insulating layers.

As signals propagate from chip package 101 over traces 102 to the DIMM modules 120 and 130, there are reflections of the signal originating at the far DIMM module 130 and traveling back toward the near DIMM module 120 along the same traces. These reflections may cause loss of signal integrity at the near DIMM module 120. Therefore, this example embodiment includes EBG structure 103 which is placed between the DIMM modules 120, 130 to attenuate signals that would otherwise cause reflections. EBG structure 103 is shown in this example as a rectangle for simplicity, but it is understood that it may be implemented using any appropriate physical structure, such as slots in either or both of the ground planes, varying width portions of the traces, varying dielectric medium of the PCB 104, and/or the like.

Figure 2:
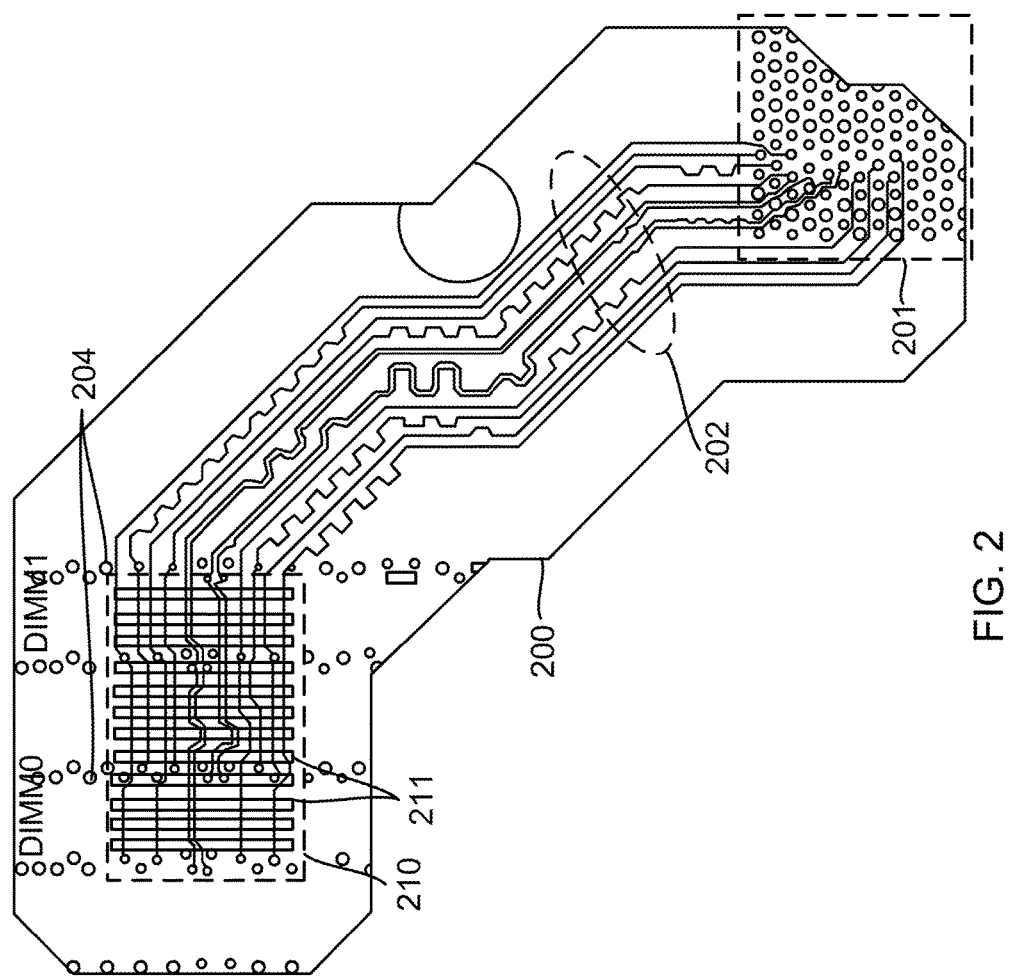
FIGS. 2-4 are illustrations of example printed circuit boards having two DIMM modules and EBG structures, according to various embodiments.

FIG. 2 is an illustration of an example PCB 200, which illustrates in more detail a particular physical implementation of PCB 104 of FIG. 1A. Area 201 indicates where chip package 101 would be coupled to the PCB 104 of FIG. 1. The various holes (e.g., vias) provide electrical communication from pins of the chip package 101 to layers and structures within the PCB 200. The topmost ground plane 105 is eliminated from this view for ease of reference, and it is understood that the topmost ground plane 105 would be placed in a layer above traces 202.

Traces 202 are conductive lines on one or more layers of the PCB 200, and they couple pins of the chip package 101 to pins of the DIMM modules. DIMM module 1 represents near DIMM module 120 of FIG. 1, and DIMM module 0 represents far DIMM module 130 of FIG. 1. In this view, the DIMM modules are eliminated for ease of reference, and it is understood that the pins of the DIMM modules 1 and 0 would be coupled to PCB 200 and the traces 202 through holes such as holes 204.

Further in this example, DIMM module 1 and DIMM module 0 are electrically coupled to the traces using the same channels, so that the chip package 101 communicates with only one of the DIMM modules at a given time. Or put another way, the traces 202 couple the DIMM module 0 and DIMM module 1 to the chip package in area 201 using a multi-drop bus architecture in which both DIMM modules couple to the same traces. Area 210 indicates a portion of the ground plane in which the EBG structure is implemented. As shown, the EBG structure has multiple rectangular slots cut into the bottommost ground plane. The pitch and width of each of the rectangular slots collectively determine the frequency band at which the EBG structure provides attenuation. Example slots are shown as 211 in this example. The rectangular slots of the EBG structure are arranged so that their length dimension is perpendicular to a length dimension of the traces 202, and the EBG structure underlies the area between the two DIMM modules as well as areas directly underneath each of the two DIMM modules. The EBG properties of the rectangular slots may be modeled using equations, such as (1)-(3) below:

$$k = \frac{1}{L}\cos^{-1}\left[\frac{A+D}{2}\right] \quad \text{Equation (1)}$$

$$A = \cosh\gamma_1 l_1 \cosh\gamma_2 l_2 + \frac{z_1}{z_2}\sinh\gamma_1 l_1 \sinh\gamma_2 l_2 \quad \text{Equation (2)}$$

$$D = \cosh\gamma_1 l_1 \cosh\gamma_2 l_2 + \frac{z_2}{z_1}\sinh\gamma_1 l_1 \sinh\gamma_2 l_2 \quad \text{Equation (3)}$$

In Equations (1)-(3), Z1 is impedance of first medium, Z2 is impedance of second medium, l1 is length of first medium, l2 is length of second medium, Y1 is propagation constant of first medium, Y2 is propagation constant of second medium, L is length of periodic unit cell (L=l1+l2).

Figure 3:
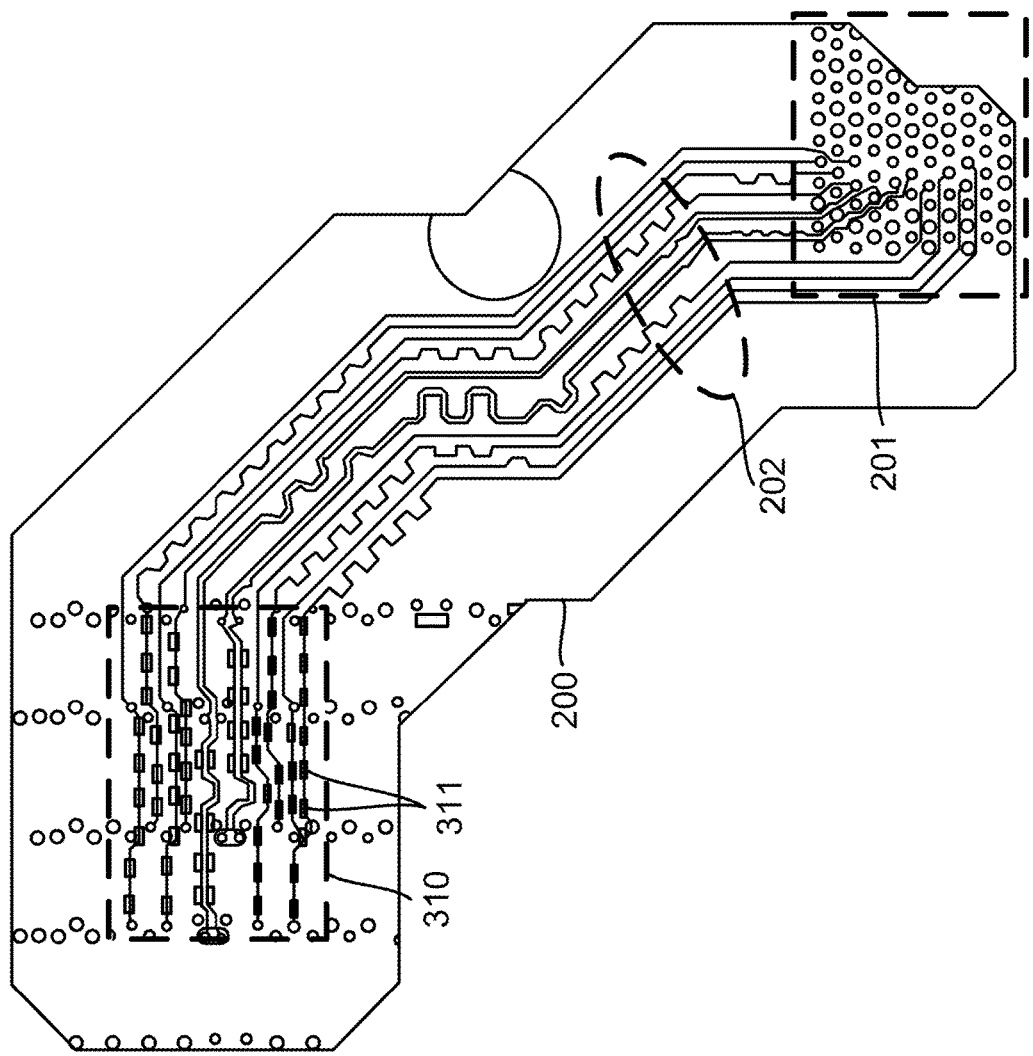

FIG. 3 is an illustration of the example PCB 200, but with a different physical implementation of the EBG structure. In the example of FIG. 3, area 310 indicates the area in which the EBG structure is located. Specifically, the EBG structure includes varied width sections of each of the conductive traces 202 within area 310. An example of varied width sections include sections 311, which are wider than other portions of the same trace. The width and pitch of the varied width sections determines the frequency band at which the EBG structure provides attenuation. In other words, rather than implementing the EBG structure as slots in a ground plane, the embodiment of FIG. 3 implements the EBG structure on the conductive traces themselves.

Figure 4:
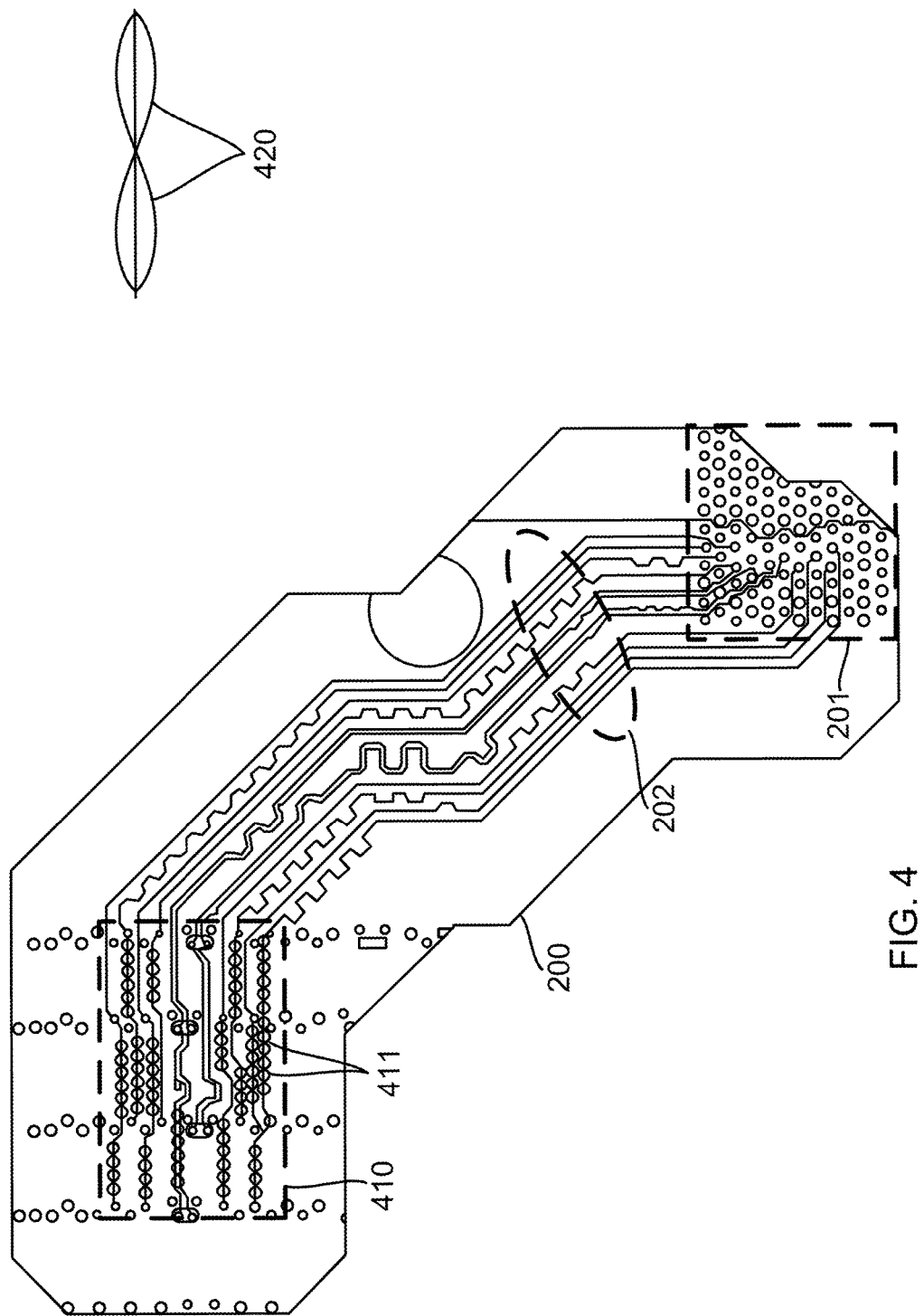

FIG. 4 is another illustration of an example PCB 200 with yet another physical implementation of the EBG structure different from those shown above with respect to FIGS. 2 and 3. Area 410 indicates the area in which the EBG structure is implemented. Specifically, in this example the EBG structure is implemented as a multitude of sinusoidal-shaped slots in the bottommost ground plane. An example of slots is shown at items 411. Further in this example, a length dimension of each of the sinusoidal-shaped slots is aligned parallel with the primary direction of the length dimension of traces 202. FIG. 4 includes example sinusoidal-shaped slots 420 showing how two adjacent sinusoidal-shaped slots might appear under magnification. The frequency at which the EBG structure provides attenuation is determined by the period and amplitude of the shape of the sinusoid. Furthermore, other embodiments may use multiple sinusoids with different periods and shapes as appropriate. The EBG properties of the sinusoidal slots may be modeled using equations, such as Equations (4)-(8) below:

$$R = \left[\frac{\gamma^2 \sinh^2(sD)}{s^2\cosh^2 sD + (\Delta k/2)^2 \sinh^2 sD}\right] \quad \text{Equation (4)}$$

$$\gamma = \frac{k_1 M}{4} \quad \text{Equation (5)}$$

$$\Delta k = 2k_1 - K \quad \text{Equation (6)}$$

$$s = \sqrt{\gamma^2 - \left(\frac{\Delta k}{2}\right)^2} \quad \text{Equation (7)}$$

$$K = \frac{2\pi}{L'} \quad \text{Equation (8)}$$

In Equations (4)-(8), R is reflectance, D is length of structure, M is Sinusoidal Modulation of dielectric constant, k1 is wave number of periodic medium, L is period of the periodic cell.

Figure 5:
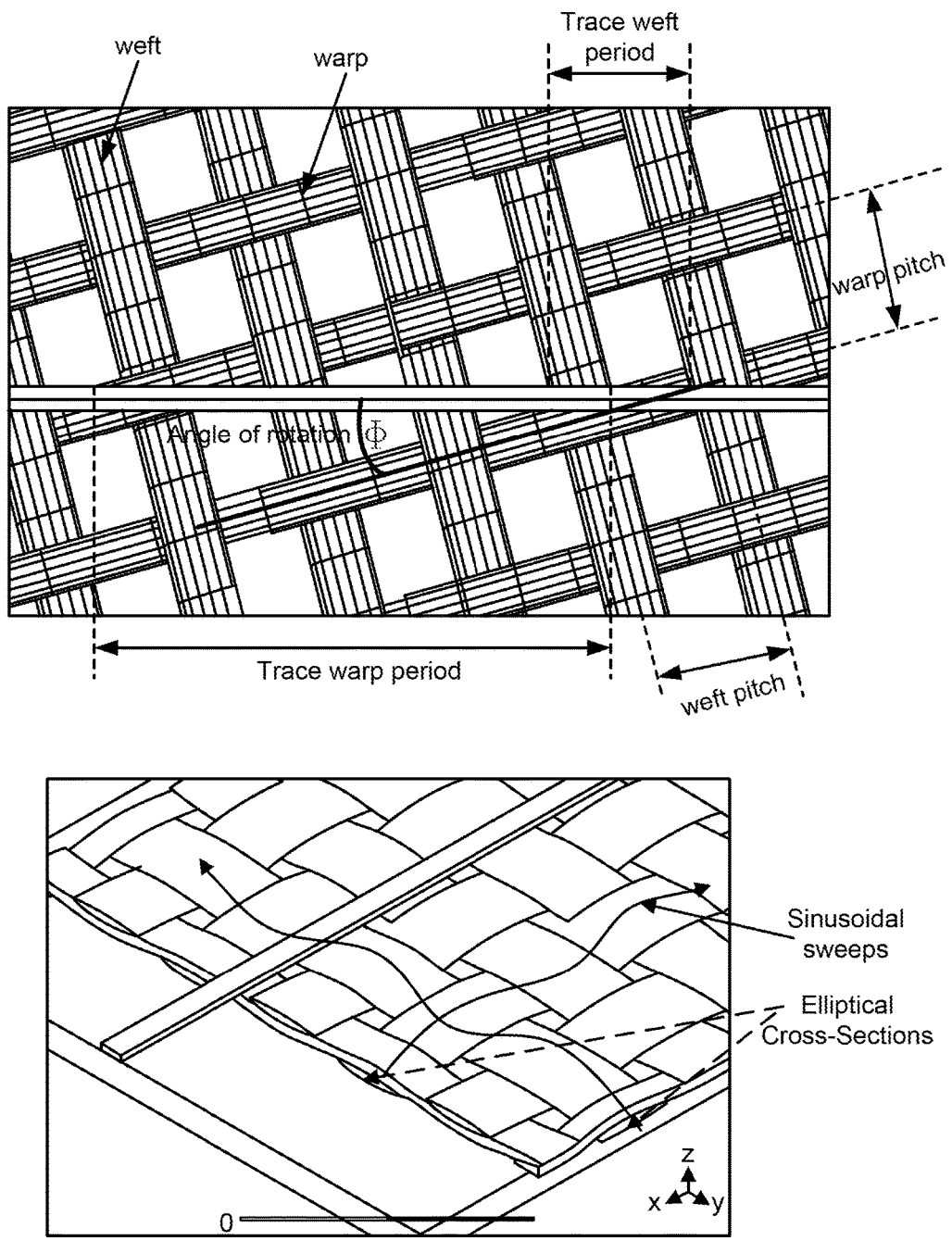
FIG. 5 is an illustration of an example EBG structure that may be implemented in a printed circuit board, according to one embodiment.

FIG. 5 is yet another illustration of a physical implementation of an EBG structure. FIG. 5 shows a top-down view and a perspective view of a fiber weave in a layer of a PCB, such as PCB 104 of FIGS. 1A and 1B. Weaves' type and angle of rotation of trace with respect to weave may be configured to have a varying dielectric medium that provides desirable EBG properties. Dielectric laminate PCBs are commonly made of fiberglass strings woven as reinforcement for the resin medium. Woven fiberglass cloths may be configured to form a periodic medium with alternating fiberglass and resin regions. These periodic regions can be designed to form EBG structures in the PCB medium. By tuning the fiber weave parameters, band gap frequency and bandwidth can be controlled. Looking at the example of FIG. 1B, one or more layers of fiber weave may be placed between traces 102 and ground plane 105 and/or between traces 102 and ground plane 106.

For instance, there are various possible techniques for tuning the periodic medium geometries and controlling band gap frequencies. One example includes selection of a weave type, such as with various widths of the wrap and weft. Another example is selection of resin and fiberglass dielectric constants. Yet another example includes angle of rotation of the routing with respect to the fiber weave orientation. Another example includes a cross-sectional shape (e.g., sinusoidal cross-section) of the fiber weave bundles. An engineer may simulate a PCB having various periodic medium geometries to find one or more geometries that provide desirable EBG properties. Various embodiments may then be implemented using one or more layers in a PCB that include EBG structures to provide a desired amount of reflection attenuation.

FIGS. 2-5 are provided to illustrate that EBG structures may take a variety of different physical implementations. Furthermore, while the examples of FIGS. 2 and 3 show slots in the bottommost ground plane, it is understood that slots may be implemented in the topmost ground plane or in both ground planes as appropriate. Furthermore, the EBG structures of the illustrated embodiments are located in different layers of the PCB than are the traces, and specifically, are located laterally (in the X-dimension in FIG. 1A) between the memory modules. However, the EBG structures may be scaled as appropriate so that they are not just laterally between the memory modules, but span into areas that laterally underlie either or both of the memory modules. In any event, EBG structures may be adapted for use in various embodiments to attenuate reflections in a multi-drop bus.

Figure 6:
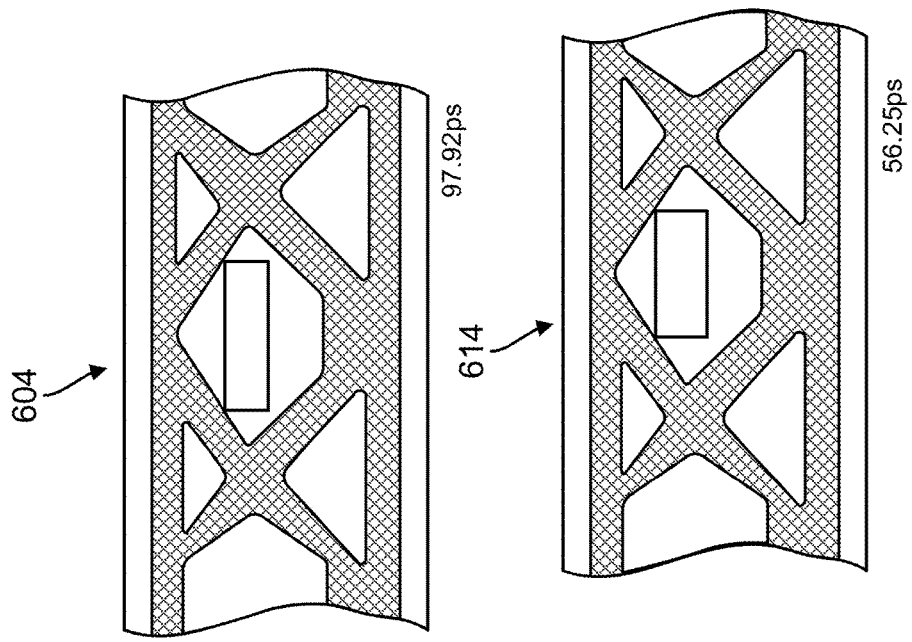
FIG. 6 is an illustration of an example timing performance comparison for a near memory module and a far memory module both with and without EBG structures, according to one embodiment.
Figure 6:
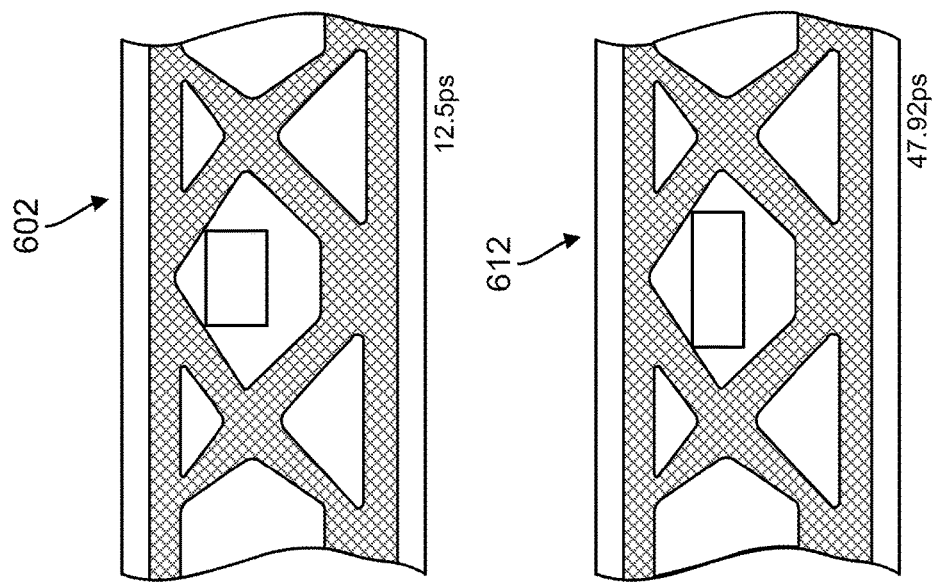
Figure 7:
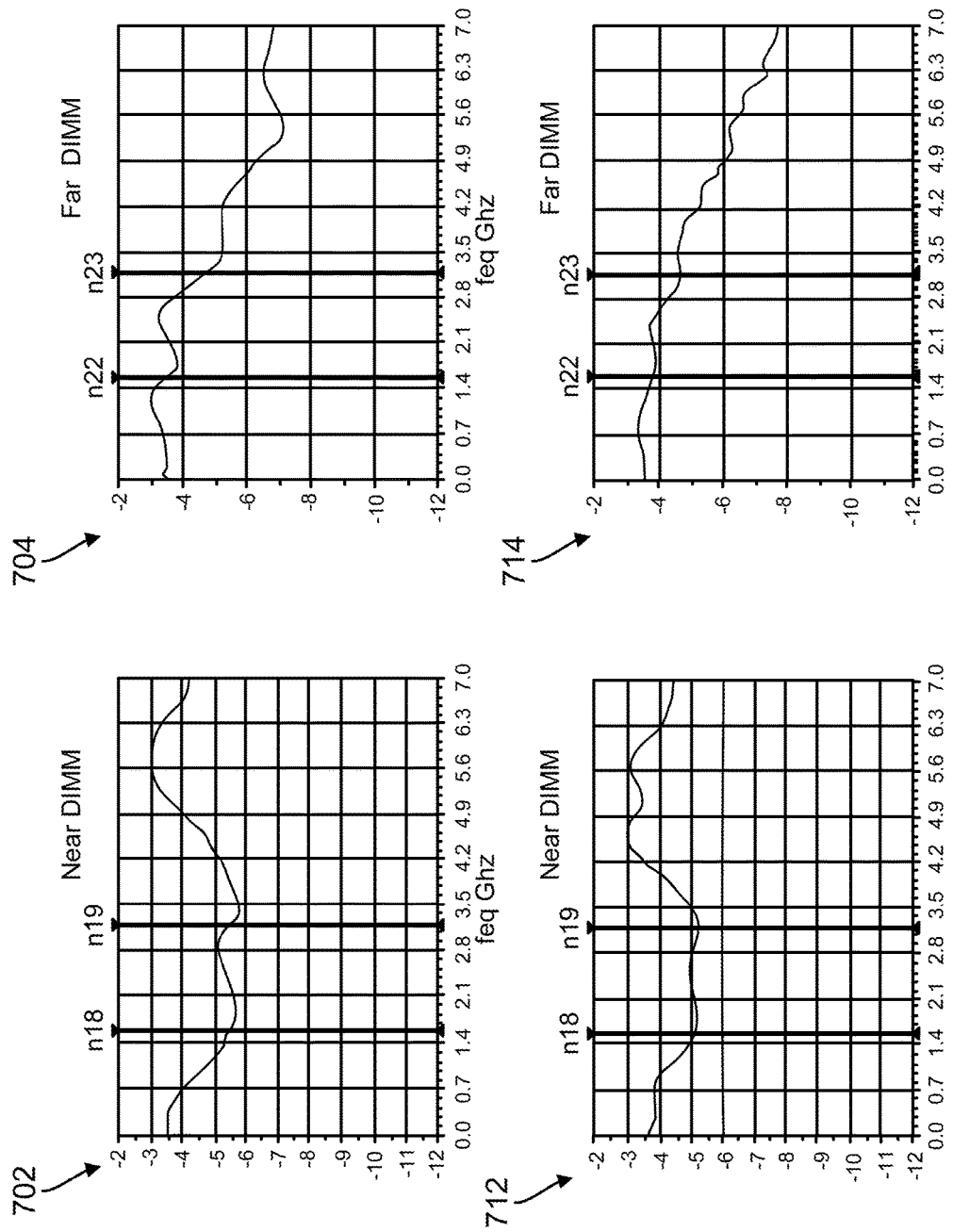
FIG. 7 is an illustration of an example frequency domain insertion loss performance comparison for a near memory module and a far memory module both with and without EBG structures, according to one embodiment.

FIG. 6 is an illustration of four different example eye diagrams 602, 604, 612, 614, according to one embodiment. FIGS. 6-7 show numbers for margin, time, and voltage, and these numbers are for illustration only. Other embodiments may have different numbers for such parameters as appropriate. The eye diagrams 602, 604, 612, 614 show a time domain representation of multiple bit transitions overlaid on a same display. The diagrams of FIG. 6 may be acquired through simulation or testing.

Taking diagram 612 as an example, it shows a multitude of bit transitions, according to either a simulation or measurement, as they would occur at the near DIMM module (DIMM module 1). Generally, the tighter the lines in a given eye diagram, the less variance there is between different transitions at different times. Greater variance may often be caused by inter-symbol interference, which itself may be the result of signal reflections.

Eye diagram 614 illustrates bit transitions at the far DIMM module (DIMM module 0) according to either simulation or measurement. Both eye diagrams 612 and 614 represent behavior that would be expected with the embodiments shown in FIGS. 1-5. The openness of the middle portion of the eye diagram illustrates a time available to capture a bit during a transition. For instance, a clock may sample data, so the clock edge would preferably be placed in the middle of the eye diagram, where the middle represents the highest binary 1 and the lowest binary 0. It is typically undesirable to sample too early or too late, as the bit may not be captured correctly. The larger the opening in the eye, the more time is available to capture the bit. Correspondingly, the more tightly the lines overlap in the eye diagram with less variance, the more time there is available to capture the bit.

The rectangles in the middle of eye diagrams 612, 614 is a JEDEC Solid State Technology Association specification, and it corresponds to a desired time to capture a bit. Margin refers to a time illustrated by the distance between a corner of the rectangle and the nearest line in the eye diagram. The smaller the margin, the less time there is available to capture the bit. Looking at eye diagrams 612 and 614, there is a margin of 47.92 ps and 58.25 ps, respectively. Such values may or may not be acceptable for a given application. However, these numbers are in contrast to the margins shown with respect to eye diagrams 602, 604. Eye diagrams 602, 604 correspond to a system similar to that shown in any of FIGS. 1-5, but without the EBG structures to attenuate reflections. Eye diagrams 602, 604 show a margin of 12.50 ps and 97.92 ps, respectively.

Accordingly, without the use of EBG structures, such other embodiments would be expected to have diminished timing performance at the near DIMM module due to reflections. Furthermore, the large discrepancy between margin at the near DIMM module versus margin at the far DIMM module indicates that the near DIMM module may cause a performance bottleneck for the system, and may even have a timing performance that is unacceptable for some applications.

The addition of the EBG structures may attenuate reflections, but also attenuate the signal from the chip as well, thereby somewhat diminishing timing performance at the far DIMM module. However, in some instances, the improved margin at the near DIMM module may move the timing performance of the near DIMM module from an unacceptable level to an acceptable level, depending on the particular application. In other words, some diminished performance at the far DIMM module may be an acceptable price to pay for increased performance at the near DIMM module, especially in applications where both of the DIMM modules fall within an acceptable level of margin.

FIG. 7 is an illustration of four example frequency diagrams 702, 704, 712, 714, according to one embodiment. Diagram 702, 704 are frequency domain diagrams that correspond to the eye diagrams 602, 604, respectively, of FIG. 6. Similarly, diagrams 712, 714 are frequency domain diagrams that correspond to the eye diagrams 612, 614, respectively. Diagrams 702, 704, 712, 714 illustrate attenuation in the frequency bands from about 1.6 GHz to 3.3 GHz, which in some embodiments may be a fundamental frequency band of interest. For instance, some embodiments may use signals within that frequency band to transmit data from a chip to DIMM modules, as shown in FIG. 1.

Diagrams 712, 714 show simulated performance using the EBG structures of FIG. 2. These are compared with the diagrams 702, 704 that show simulated performance using an embodiment that does not include EBG structures. Once again, improved performance at the near DIMM module, attributable to use of EBG structures to increase gain at the near DIMM module, is apparent from the diagrams. The frequency bands in FIG. 7 are for illustrative purposes, and it is understood that other embodiments may use different frequency bands.

An advantage of some embodiments is that the EBG structures of FIGS. 1-5 may provide acceptable timing performance for systems having two DIMM modules electrically coupled by a daisy chained stub without perceptible performance loss at either of the DIMM modules.

Furthermore, the embodiments shown in FIGS. 1-5 may provide acceptable performance even in applications when only one DIMM module is coupled to the PCB. This is in contrast to a conventional Tee topology, which would typically be expected to return poor results when only one DIMM module populates the board. Therefore, various embodiments described herein may include boards used for both single-DIMM module and dual-DIMM module applications as appropriate. In other words, other embodiments may include variations on the systems of FIGS. 1-5, wherein only one of the memory module slots is populated (e.g., either the far slot or the near slot, but not both).

Moreover, some solutions described above with respect to FIGS. 1-5 may be counterintuitive and provide unexpected results. For instance, some of the solutions described above include diminished timing performance at a far memory module, whereas conventional solutions tend to focus on improving timing performance when possible. Nevertheless, the reduced timing performance at the far memory module may be offset by improved timing performance at the near memory module, thereby allowing higher bit rates on the bus overall when compared to bit rates that would be available on the bus without the use of EBG structures to attenuate reflections.

Various embodiments may find utility in a variety of applications. In one example, boards having processors, at least one memory module, and an EBG structure may be employed in computing systems, such as servers, desktop computers, laptop computers, and the like. However, the scope of embodiments is not limited thereto, as boards for use in mobile devices may be adapted according to the principles described herein.

Figure 8:
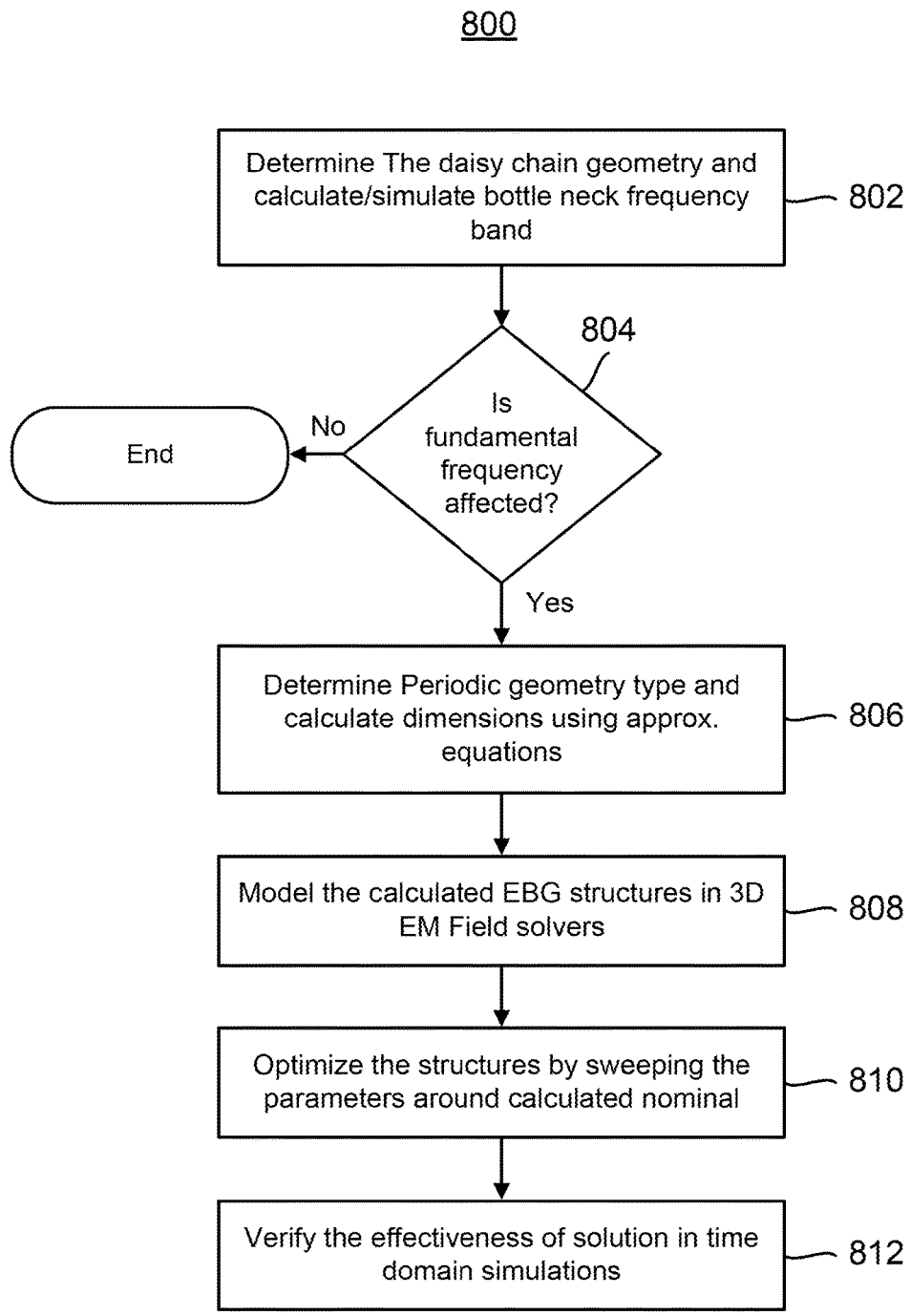
FIGS. 8-9 illustrate an example method to design the structures of FIGS. 1-5, adapted according to one embodiment.

FIG. 8 is an illustration of an example method 800 for designing a system having EBG structures, according to one embodiment. Method 800 may be performed, for example, by an engineer using one or more simulation tools.

At action 802, an engineer determines the daisy chain geometry of the board and then simulates timing performance of one or both of the DIMM modules at the desired frequency band. At action 804, the engineer determines whether the desired frequency band, the fundamental frequency, is affected. For instance, at actions 802-804, the engineer may simulate the design using time domain and/or frequency domain techniques to determine whether timing performance is diminished in the desired frequency band. If the desired frequency band is affected at action 804, then method 800 moves to action 806. Otherwise, the inquiry may stop.

At action 806, the engineer determines periodic geometry type and calculates dimensions using approximate equations. In some examples, action 806 includes coming up with best guess dimensions for EBG structures. For instance, best guess may include pitch and width (FIGS. 2 and 3) or sinusoidal frequency and amplitude (FIG. 4), or other parameter for an appropriate EBG structure. Action 806 may include using equations, such as those discussed above with respect to FIGS. 2 and 4 to initially set parameters. At action 808, the engineer models the calculated EBG structures in a three dimensional electromagnetic field solver program. The modeling produces information similar to that of FIGS. 6 and 7, allowing the engineer to determine frequency gain and timing performance for the structures.

At action 810, the engineer optimizes the structures by sweeping the parameters around calculated nominal values. For instance, the engineer may change pitch, width, sinusoidal frequency, amplitude of a structure and perform the modeling of action 808 to further refine the shape and enhance performance. Action 810 may be iterative with redesign and modeling.

Figure 9:
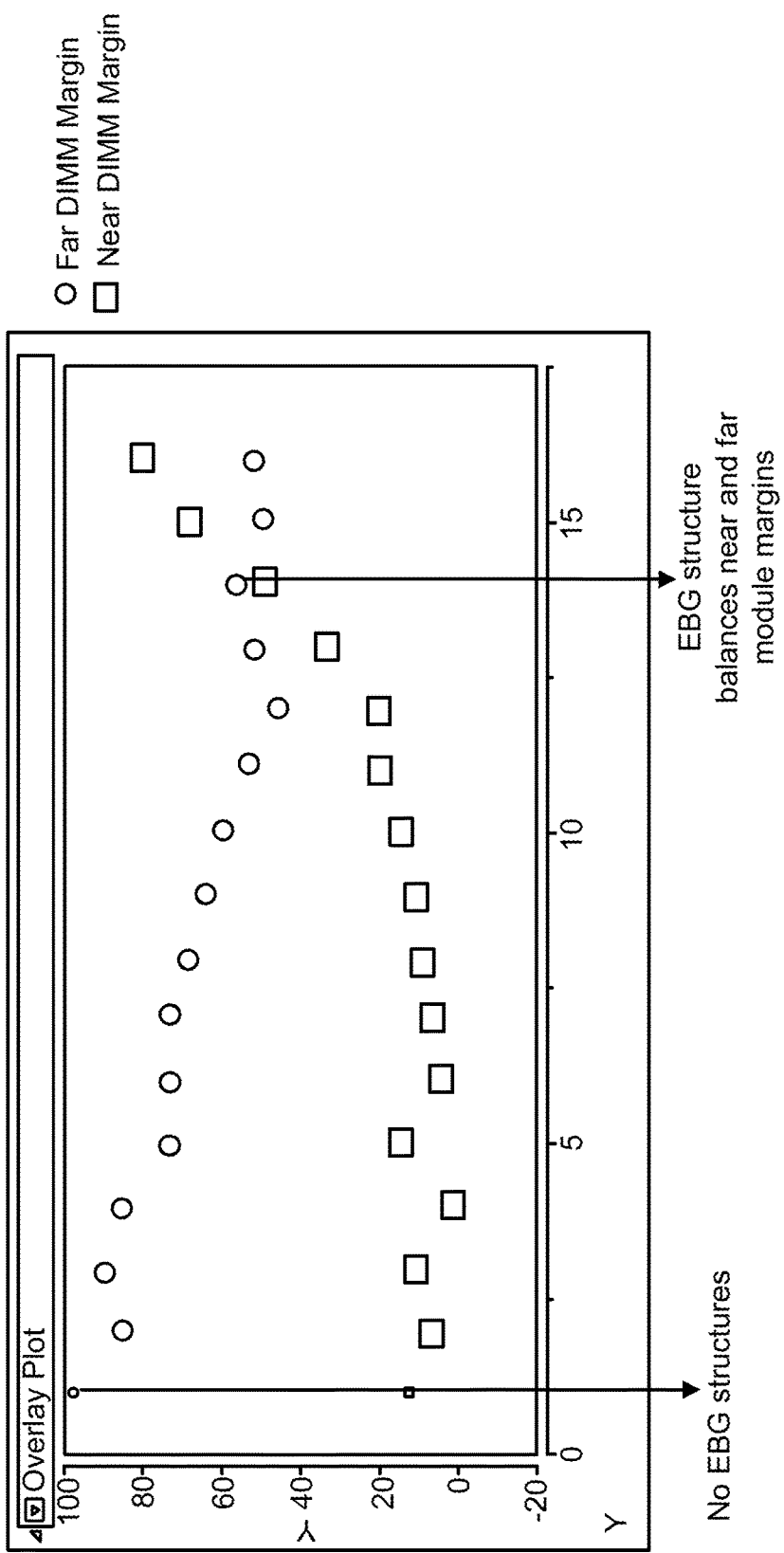

Action 812 includes verifying the effectiveness of the solution in time domain simulations. Example time domain simulations include eye diagrams and may further include analyzing timing margin and noise margin. If the solution is not effective, the method 800 may return to action 810 to further enhance the design until it is acceptable. FIG. 9 is an illustration of an example plot of results during the actions 810 and 812, where an engineer may simulate designs to test margins for both a near DIMM and a far DIMM. In the example of FIG. 8, a solution is where performance of the near DIMM and the far DIMM margins are substantially similar and are within an acceptable range for the application.

Figure 10:
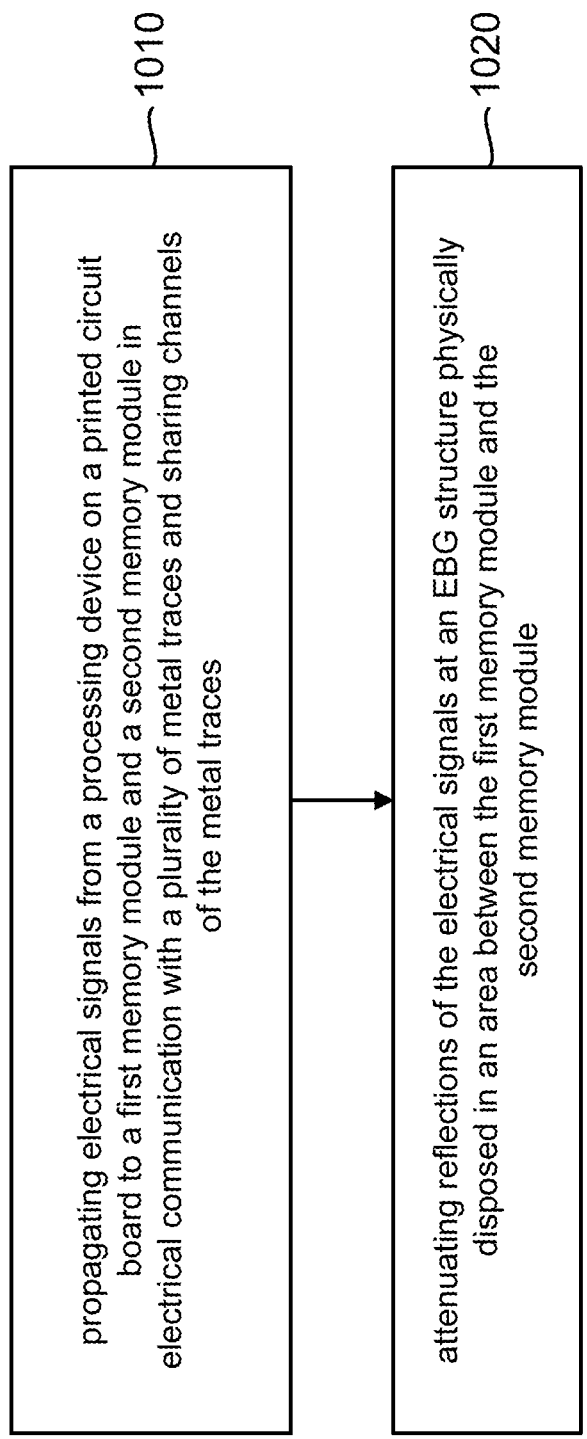
FIG. 10 illustrates an example method of use of the systems shown in the FIGS. 1-5, according to one embodiment.

Various embodiments may include methods for use of the systems of FIGS. 1-5. For instance, FIG. 10 illustrates an example method 1000, for use of the systems of FIGS. 1-5. The actions of method 1000 may be performed, for example, by a computing apparatus, such as that shown in FIG. 1A, having a chip package in electrical communication with two memory modules. An example may include normal operation of a server or other computer including a board adapted according to the principles described herein.

Continuing with this example, action 1010 includes propagating an electrical signal from a processing device on a PCB to a first memory module and a second memory module in electrical communication with a plurality of metal traces and sharing channels of the metal traces. The processing device may include, e.g., a central processing unit (CPU), digital signal processor (DSP), graphics processing unit (GPU) or other appropriate processing unit. The processing device performs operations including writing data to the memory modules and reading data from the memory modules.

The memory modules themselves store data and access data in response to commands from the processing device. Propagating electrical signals may be performed by electrical traces, such as those illustrated in FIGS. 1-4.

Additionally, the metal traces may be configured as a multi-drop bus so that each of the memory modules are physically and electrically coupled with the same ones of the traces. In this example, action 1010 may include the electrical signal propagating along the bus, though any particular instruction or data may be addressed to only a given one of the memory modules.

Action 1020 includes attenuating reflections of the electrical signal at an EBG structure. The EBG structure may be physically disposed in an area between the first memory module and the second memory module. Different physical placements are shown and discussed above with respect to FIGS. 1-4.

The scope of embodiments is not limited to the actions shown in FIG. 10. For instance, other embodiments may add, omit, rearrange, or modify one or more the actions. In one example, a board is populated similarly to that of FIG. 1A, except that only one of the memory modules is populated on the board. In such an example, propagating electrical signals may be performed with respect to only that single memory module. Similarly, other embodiments having three or more memory modules may include propagating electrical signals to each one of those memory modules.

Furthermore, the actions 1010 and 1020 may be repeated continuously throughout operation of the device. The EBG structure may thus provide attenuation of electromagnetic reflection, and in some instances provide increased performance of the device.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A system comprising:
   a printed circuit board having a bus with a plurality of conductive traces;
   a processing device coupled to the printed circuit board and in electrical communication with the plurality of conductive traces;
   a first memory module and a second memory module in electrical communication with the plurality of conductive traces and sharing channels of the conductive traces, wherein the first memory module is physically more proximate to the processing device than is the second memory module; and
   an electronic band gap (EBG) structure physically disposed in an area between the first memory module and the second memory module and configured to affect signals transmitted on the bus from the processing device to the first memory module and the second memory module.

2. The system of claim 1, wherein the first memory module comprises a first Dual Inline Memory Module (DIMM), and wherein the second memory module comprises a second DIMM.

3. The system of claim 1, wherein the bus is configured as a multi-drop bus.

4. The system of claim 1, wherein the printed circuit board includes a first ground plane and a second ground plane, further wherein the plurality of conductive traces is arranged between the first ground plane and the second ground plane.

5. The system of claim 4, wherein the EBG structure includes a plurality of rectangular slots in the first ground plane.

6. The system of claim 4, wherein the EBG structure includes a plurality of sinusoidal-shaped slots in the first ground plane.

7. The system of claim 1, wherein the EBG structure includes varied width sections of the conductive traces.

8. The system of claim 1, wherein the EBG structure is physically disposed in areas underneath the first memory module and the second memory module.

9. The system of claim 1, wherein the EBG structure comprises a varying dielectric medium of the printed circuit board.

10. A system comprising:
- a printed circuit board having a bus disposed on a first layer and a first ground plane disposed on a second layer;
- a processing device having a central processing unit (CPU) and coupled to the printed circuit board and coupled to the bus;
- a first Dual Inline Memory Module (DIMM) and a second DIMM disposed on the printed circuit board and coupled to the bus and configured to share channels of conductive traces of the bus to communicate signals with the CPU, wherein the first DIMM is physically more proximate to the CPU than is the second DIMM; and
- an electronic band gap (EBG) structure disposed on the printed circuit board more proximate to the CPU than is the second DIMM and configured to affect signal reflections on the bus originating at the second DIMM.

11. The system of claim 10, wherein the bus is configured as a multi-drop bus.

12. The system of claim 10, wherein the printed circuit board includes a second ground plane disposed on a third layer, further wherein the conductive traces are arranged between the first ground plane and the second ground plane.

13. The system of claim 12, wherein the EBG structure includes a plurality of rectangular slots in the first ground plane.

14. The system of claim 12, wherein the EBG structure includes a plurality of sinusoidal-shaped slots in the first ground plane.

15. The system of claim 10, wherein the EBG structure includes varied width sections of the conductive traces.

16. The system of claim 10, wherein the EBG structure is physically disposed in layers of the printed circuit board underneath the first DIMM and the second DIMM.

17. The system of claim 10, wherein the EBG structure comprises a varying dielectric medium of the printed circuit board.

18. A system comprising:
- a printed circuit board having a bus disposed on a first layer and a ground plane disposed on a second layer;
- a multi-core system on chip (SOC) disposed on the printed circuit board and coupled to the bus;
- a first Dual Inline Memory Module (DIMM) and a second DIMM disposed on the printed circuit board and coupled to the bus and configured to share channels of conductive traces of the bus to communicate signals with the SOC, wherein the first DIMM is physically more proximate to the SOC than is the second DIMM; and
- an electronic band gap (EBG) structure disposed within a layer of the printed circuit board and underlying an area between the first DIMM and the second DIMM.

19. The system of claim 18, wherein the EBG structure includes a plurality of slots in the ground plane.

20. The system of claim 18, wherein the EBG structure includes varied width sections of the conductive traces.

* * * * *